(12) United States Patent
Lammers et al.

(10) Patent No.: US 10,381,036 B1
(45) Date of Patent: Aug. 13, 2019

(54) LASER BIAS CALIBRATION

(71) Applicant: Seagate Technology LLC, Cupertino, CA (US)

(72) Inventors: Todd Michael Lammers, Lafayette, CO (US); Abdelkrim Tatah, Eden Prairie, MN (US); Tim Rausch, Farmington, MN (US); Robert Matousek, Berthoud, CO (US)

(73) Assignee: Seagate Technology LLC, Cupertino, CA (US)

( * ) Notice: Subject to any disclaimer, the term of this patent is extended or adjusted under 35 U.S.C. 154(b) by 48 days.

(21) Appl. No.: 15/136,829

(22) Filed: Apr. 22, 2016

Related U.S. Application Data

(63) Continuation-in-part of application No. 15/052,477, filed on Feb. 24, 2016, now Pat. No. 9,741,385, which is a continuation-in-part of application No. 15/045,207, filed on Feb. 16, 2016, now Pat. No. 10,056,132.

(51) Int. Cl.
| | | |
|---|---|---|
| *G11B 7/126* | (2012.01) | |
| *G06F 13/42* | (2006.01) | |
| *G06F 3/06* | (2006.01) | |
| *H03F 17/00* | (2006.01) | |
| *G11B 5/00* | (2006.01) | |
| *H01S 3/13* | (2006.01) | |

(52) U.S. Cl.
CPC ............... *G11B 7/126* (2013.01); *G06F 3/06* (2013.01); *G06F 13/42* (2013.01); *G11B 2005/0021* (2013.01); *H01S 3/13* (2013.01); *H03F 17/00* (2013.01)

(58) Field of Classification Search
CPC ..... G11B 7/1263; G11B 7/1267; G11B 7/126; G11B 7/125; G06F 3/06; G06F 13/4273; H03F 17/00; H01S 3/13
See application file for complete search history.

(56) References Cited

U.S. PATENT DOCUMENTS

| | | | | |
|---|---|---|---|---|
| 4,427,296 A | * | 1/1984 | Demarest | G01B 11/105 250/239 |
| 4,542,986 A | * | 9/1985 | Berdanier | G01S 7/4811 250/334 |
| 4,561,775 A | * | 12/1985 | Patrick | G01S 7/4811 250/332 |
| 4,569,591 A | * | 2/1986 | Ford | G01S 7/4811 356/153 |
| 4,689,795 A | * | 8/1987 | Yoshimoto | H01S 5/06835 372/26 |
| 4,733,961 A | * | 3/1988 | Mooney | G01S 7/4813 250/342 |
| 4,803,497 A | | 2/1989 | Kennedy, Jr. | |
| 5,093,660 A | | 3/1992 | Beaducel | |

(Continued)

*Primary Examiner* — Getente A Yimer
(74) *Attorney, Agent, or Firm* — Cesari & Reed, LLP; Kirk A. Cesari

(57) ABSTRACT

Systems and methods of laser bias calibration are presented. A preamplifier circuit may include a laser voltage monitor circuit and a laser bias control circuit configured to automatically adjust an output laser bias threshold voltage based on a monitored laser voltage. The laser bias control circuit may include a first differentiator circuit, a second differentiator circuit, and a threshold detection circuit. The preamplifier circuit may be utilized in a heat assisted magnetic recording device.

16 Claims, 6 Drawing Sheets

(56) References Cited

U.S. PATENT DOCUMENTS

| | | |
|---|---|---|
| 5,218,630 A | 6/1993 | Patsiokas |
| 5,235,575 A | 8/1993 | Han |
| 5,568,464 A * | 10/1996 | Horie .................... G11B 7/126 369/116 |
| 5,668,470 A | 9/1997 | Shelor |
| 5,726,821 A | 3/1998 | Cloke et al. |
| 5,923,100 A * | 7/1999 | Lukens .................... G05F 1/67 136/206 |
| 6,072,761 A | 6/2000 | Tani |
| 6,122,127 A | 9/2000 | Flinsbaugh |
| 6,288,863 B1 | 9/2001 | Flinsbaugh |
| 6,532,391 B1 | 3/2003 | Nayler |
| 6,904,475 B1 | 6/2005 | Fairman |
| 7,221,305 B2 | 5/2007 | Kim |
| 7,787,206 B2 | 8/2010 | Yen |
| 7,881,000 B2 | 2/2011 | Lee |
| 8,441,909 B1 | 5/2013 | Thayamballi |
| 8,711,502 B1 | 4/2014 | Wilson et al. |
| 2002/0041417 A1 * | 4/2002 | Han ........................ H03F 3/087 398/202 |
| 2002/0176156 A1 | 11/2002 | Zahnley |
| 2003/0185260 A1 | 10/2003 | Seo |
| 2005/0180041 A1 * | 8/2005 | Kajiyama ................ G11B 5/09 360/67 |
| 2005/0274809 A1 * | 12/2005 | Colley ............... G06K 7/10851 235/462.25 |
| 2005/0276178 A1 | 12/2005 | Nishimura |
| 2006/0083136 A1 | 4/2006 | Lee |
| 2007/0096013 A1 * | 5/2007 | Sugimoto ................ H03F 3/08 250/214 A |
| 2014/0080430 A1 * | 3/2014 | Lee ..................... H04B 13/005 455/91 |
| 2015/0318030 A1 * | 11/2015 | Wilson ..................... G06F 3/06 711/106 |

* cited by examiner

LASER BIAS CALIBRATION

CLAIM TO PRIORITY

The present application claims priority to, and is a continuation-in-part of, pending U.S. patent application Ser. No. 15/052,477, filed Feb. 24, 2016, entitled "DIGITAL AUTOMATIC POWER CONTROL", which claims priority to, and is a continuation-in-part of, pending U.S. patent application Ser. No. 15/045,207, filed Feb. 16, 2016, entitled "ASSIGNABLE REGISTERS ON A PREAMP CHIP", the contents of which are incorporated herein in their entireties.

SUMMARY

In some embodiments, a device can comprise a preamplifier circuit including an output to provide current to a laser emitter, a laser voltage monitor circuit configured to determine a voltage corresponding to the output, and a laser bias control circuit configured to determine a laser threshold current level for the laser output based on the voltage and apply the laser threshold current level to an output of the laser current.

In some embodiments, a circuit can include an output to provide current to a laser emitter and a laser voltage monitor circuit configured to determine a voltage corresponding to the output. The circuit can also include a first differentiator circuit configured to calculate a first derivative of the voltage and a second differentiator circuit configured to calculate a second derivative of the voltage based on the first derivative. The circuit can further include a threshold detector circuit configured to determine a laser bias current level for the output based on the second derivative reaching a threshold, and configured to apply the laser bias current level to the output.

In some embodiments, a method can include varying a bias current of a laser emitter over a range of currents, detecting a laser voltage corresponding to the bias current, determining a laser bias current threshold value based on the laser voltage, and applying the laser bias current threshold value to the laser emitter.

DETAILED DESCRIPTION

In the following detailed description of the embodiments, reference is made to the accompanying drawings which form a part hereof, and in which are shown by way of illustrations. The features of the various embodiments and examples described herein may be combined, exchanged, removed, other embodiments utilized, and structural changes made without departing from the scope of the present disclosure.

The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

In accordance with various embodiments, dedicated hardware implementations including, but not limited to, application specific integrated circuits, programmable logic arrays, and other hardware devices can be constructed to implement the methods and functions described herein. Further, the methods and functions described herein may be implemented as a device, such as a memory device, including instructions that when executed cause a processor to perform the methods.

Figure 1:
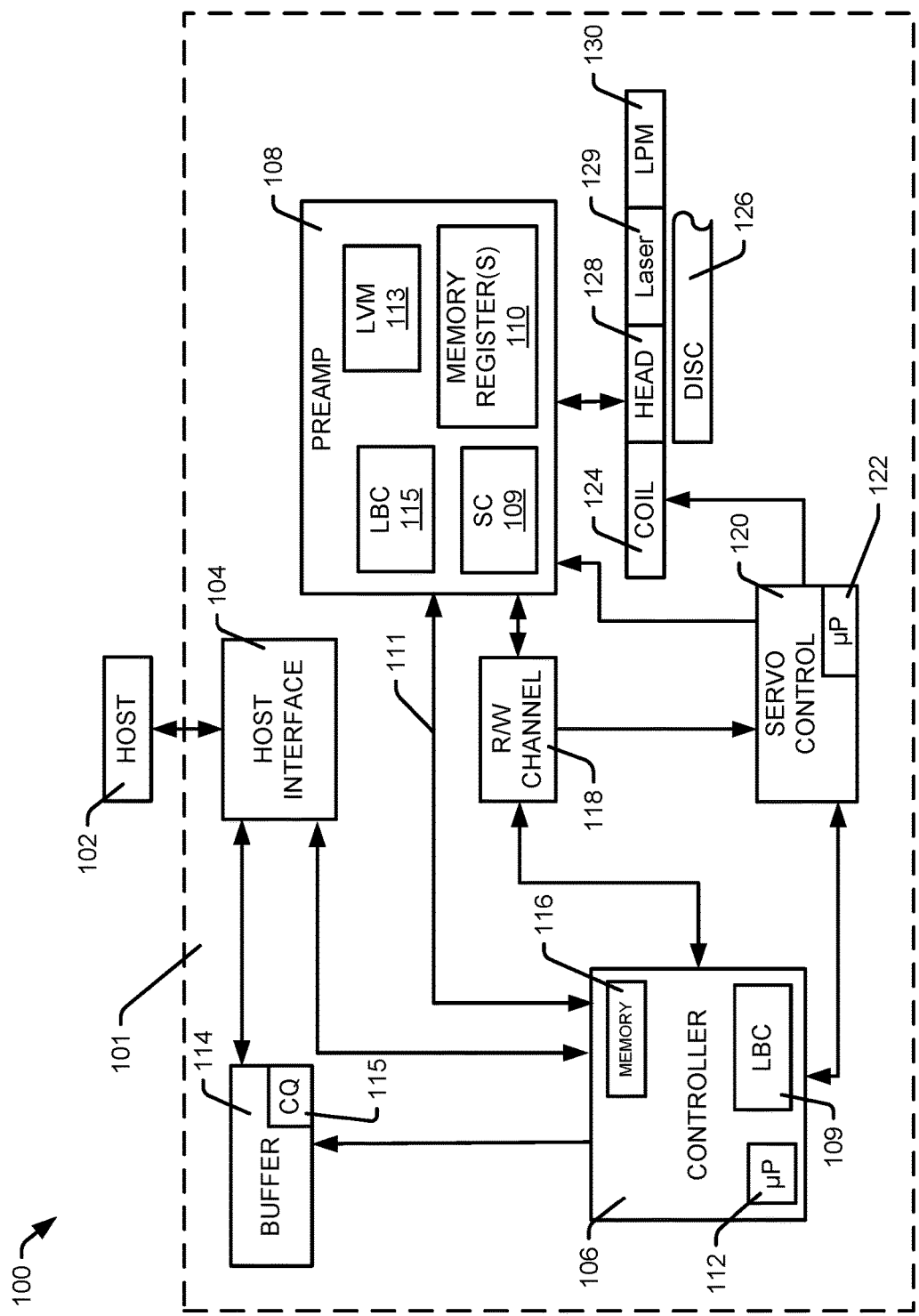
FIG. 1 is a block diagram of a system of laser bias control, in accordance with certain embodiments of the present disclosure.

Referring to FIG. 1, a diagram of a system of laser bias control is shown and generally designated 100, in accordance with certain embodiments of the present disclosure. Specifically, FIG. 1 provides a functional block diagram of an example data storage device (DSD) 101 and host 102. The DSD 101 may be a hard disc drive (HDD), a hybrid storage device, an optical storage device, or other type of storage device.

The DSD 101 can include one or more data storage mediums, such as one or more disc(s) 126, which can be a magnetic disc or an optical disc for data storage. Further, multiple discs may be included, and each storage surface of the discs 126 may have a respective laser emitter 129 and write head 128 that allow storage of data to the respective surface. In some embodiments, the DSD 101 may be a heat-assisted magnetic recording (HAMR) device that utilizes the laser emitter 129 to heat an area of the disc 126 while the head 128 is writing data to the heated area. Further, a surface of the DSD 101 may include multiple tracks for data storage, where each track is divided into multiple data sectors and multiple servo wedges.

In some embodiments, the DSD 101 can communicate with a host device 102 via a hardware and firmware-based interface circuit 104. The interface 104 may comprise any interface that allows communication between a host 102 and a DSD 101, either wired or wireless, such as Universal Serial Bus (USB), IEEE 1394 (Institute of Electrical and Electronics Engineers standard 1394), Compact Flash, Serial AT Attachment (SATA), external SATA (eSATA), Parallel ATA (PATA), Small Computer System Interface (SCSI), Serial Attached SCSI (SAS), Peripheral Component Interconnect Express (PCIe), Fibre Channel, Ethernet, or Thunderbolt, among others. The interface 104 may include a connector (not shown) that allows the DSD 101 to be physically removed from the host 102. In some embodiments, the DSD 101 may have a casing or housing containing the components of the DSD 101, or the components of the DSD 101 may be attached to the housing, or a combination thereof.

The DSD 101 may include a buffer 114, which may be volatile or nonvolatile memory, and a command queue 115, where the buffer 114 can temporarily store data during read and write operations, and the command queue (CQ) 115 can temporarily store multiple operations pending execution. Commands arriving over the interface 104 may automatically be received in the CQ 115 or may be stored there by controller 106, interface 104, or another component.

The DSD 101 can include a programmable controller 106, which can include associated memory 116 and processor 112. In some embodiments, the DSD 101 can include a read-write (R/W) channel 118, which can encode data during write operations and reconstruct user data retrieved from a memory, such as disc(s) 126, during read operations. A preamplifier circuit (preamp) 118 can apply write currents to the head(s) 128 and provides pre-amplification of read-back signals to the R/W channel 118. A servo control circuit 120 may use servo data to provide an appropriate current for the coil 124, which may be a voice coil motor (VCM), to position the head(s) 128 over a desired area of the disc(s) 126. The controller 106 can communicate with a processor 122 to move the head(s) 128 to the desired locations on the disc(s) 126 during execution of various commands, such as from the command queue 115.

Generally, during operation of the DSD 101 in a HAMR mode, the head can write data to data sectors while the laser 129 is powered on. However, the writer of the head 128 and the laser 129 must be powered off when they cross over each servo wedge and inter sector gap (ISG) to prevent overwriting of the servo information. During use of the laser 129, the emitted power may fluctuate based on various conditions such as amount of time the laser 129 is on, relative temperature, other environmental conditions, other factors, or any combination thereof. In a HAMR based recording device and other laser devices, the laser power can change relative to environmental conditions and can drift (i.e. exhibit changing variances in output power) over the laser lifetime. Specifically, heat can change the lasers threshold point (turn on) and the slope efficiency. To counteract this, a laser power monitor circuit 130 can be utilized to measure the power output of the laser 129 by providing an analog signal representative of such to the preamp 108. A laser current provided from the preamp 108 to the laser 129 can be varied to provide a consistent laser output power. In some embodiments, the laser power monitor circuit 130 may include a photodiode configured to generate a signal representative of the laser output power. Further, a bolometer or a write coil or other resistive elements can provide a power feedback that is representative of the power or voltage of the laser, such as the power at a recoding surface. Also, monitoring laser voltage may be used as a laser power indicator and may be used to determine laser threshold bias current level.

The preamp 108 may include a sampling circuit (SC) 109, which can receive an analog input, take one or more digital samples of the analog input, and store the one or more digital samples in memory register(s) 110. The SC 109 may be hardware circuit based, such as an integrated circuit within the preamp 108, or may be firmware based, such as a controller circuit or processor in combination with instructions to perform the functions described, or may be a combination of hardware circuits and firmware.

Further, the preamp 108 may include a laser bias calibration (LBC) circuit 115 to determine a laser threshold current level of the laser 129 so that an updated laser bias calibration can be achieved. The LBC circuit 115 may be configured to utilize a laser voltage monitor (LVM) circuit 113 to obtain a laser threshold value that can be used to adjust a laser threshold via the laser bias calibration circuit.

Figure 2:
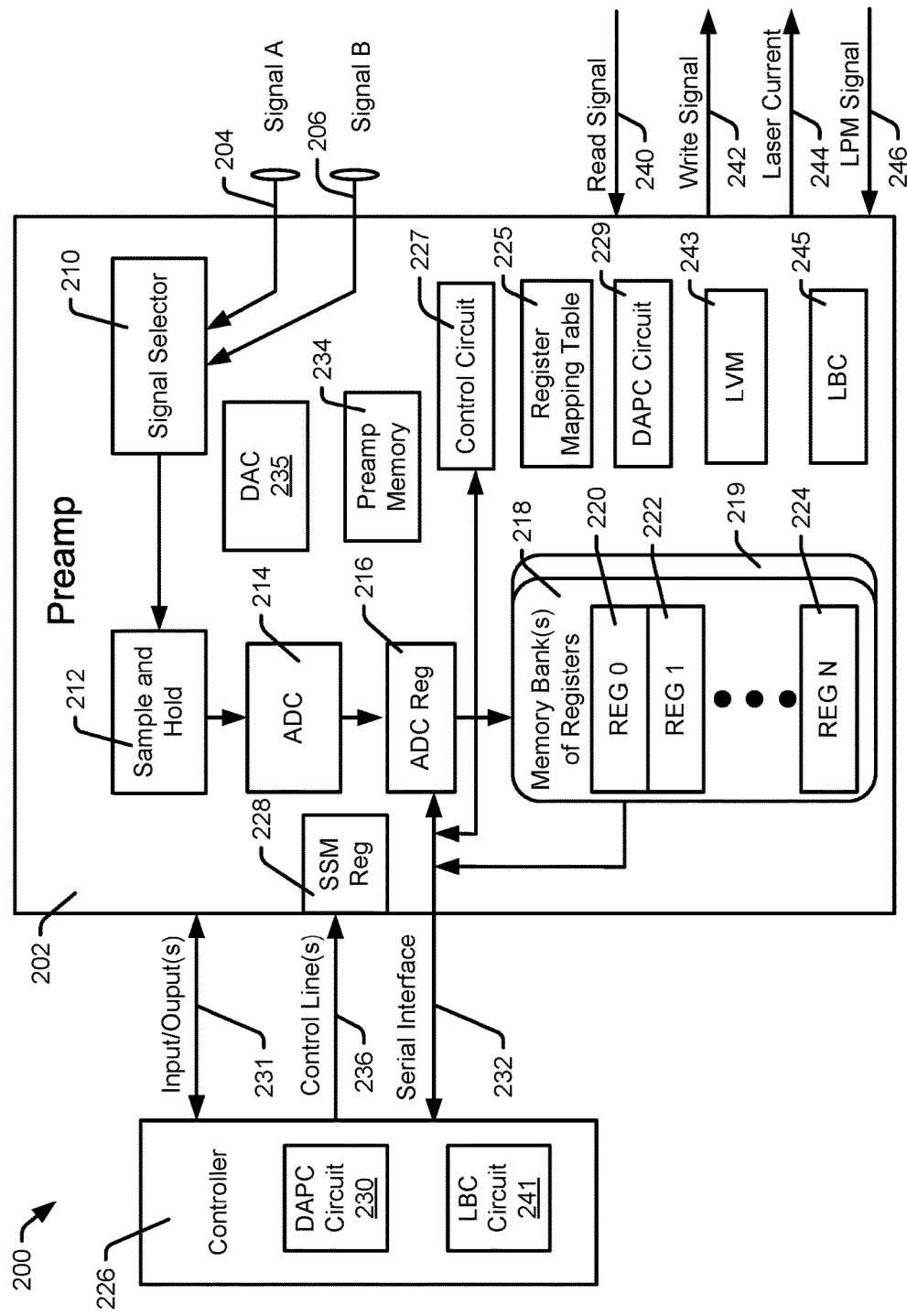
FIG. 2 is a block diagram of a system of laser bias control, in accordance with certain embodiments of the present disclosure.

Referring to FIG. 2, a block diagram of a system of laser bias control is shown and generally designated 200. The system 200 can include a preamplifier ("preamp") circuit 202 and a controller circuit 226. The controller 226 may be a data storage controller, processor, read/write channel, system-on-chip ("SOC"), application specific integrated circuit ("ASIC") or other device. The preamp circuit 202 can include a signal selector circuit 210 (e.g. digital multiplexer circuit(s)), sample and hold circuit 212, data converter circuit (e.g. analog to digital converter ("ADC")) 214, an ADC reserved register 216, programmable control register(s) 228, register mapping table 225, a memory 234, a digital to analog converter (DAC) circuit 235, and a memory bank of registers 218. The preamp 202 may optionally include other memory banks of registers, such as the memory bank of registers 219. The memory 234 may be dynamic random access memory ("DRAM"), assignable or dedicated registers, other memory, or any combination thereof.

The memory bank of registers 218 may be a virtual grouping of assignable memory contained in the preamp 202 that are assigned to store digital values produced by the ADC 214. Thus, the assignment of registers can create a cache to store ADC sampling data within the preamp circuit itself. The assignable memory may be assignable portions of DRAM, assignable registers, or other memory. The memory bank of registers 218 may be referred to as a preamp cache. Assignable registers may be registers that can be assigned to store data for different functions or operations. The memory bank of registers 218 can include multiple registers such as register zero 220, register one 222, through register N 224.

The controller 226 may send or receive signals, such as signal sample acquisition signals, power on/off signals, or other signals to the preamp 202 via input/output lines 231, control line(s) 236, or by a serial interface 232. Further, the controller 226 may determine which registers or bits may be assigned to the memory bank of registers 218, and may have prior knowledge of which registers or bits in the preamp 202 are assignable. The controller 226 may set (or clear) a control bit(s) to assign selected registers to store ADC samples, thus creating the logical grouping of registers 218.

The methods and functions described herein may be performed by a control circuit 227 or a DAPC control circuit 229, either of which may include programmable logic, hardware gates, a controller, or other circuits that allow the system operations to be performed. For example, the memory control circuit 227 may control the digitization of a selected signal and the storing of the resulting digital samples. Further, the DAPC control circuit 229 may perform automatic power control (APC) of a laser (or other power regulated device) based on digitally sampling one or more of the analog input signals, or performing functions on signals that are monitored within the preamp, such as laser voltage. Even further, in some embodiments, the controller 226 can include a DAPC circuit 230 to perform the functions described herein, or the functions may be split between the controller 226 and the preamp DAPC circuit 229.

Further, the preamplifier 202 may include a laser voltage monitor circuit 243 and a laser bias control circuit 245. The laser bias control circuit 245, or a portion thereof, may be implemented in the controller or SOC 226. The laser voltage monitor circuit 243 or the laser bias control circuit 245 may be hardware circuit based, such as an integrated circuit within the preamp 202, or may be firmware based, such as a controller circuit or processor in combination with instructions to perform the functions described, or may be a combination of hardware circuits and firmware within the preamp 202.

The laser bias control circuit 245 can be configured to calibrate a laser current level threshold of the laser current output 244. The laser bias control circuit 245 can be configured to utilize the laser voltage monitor circuit 243 to obtain the laser current threshold value.

In some embodiments, the laser voltage monitor circuit 243 may acquire a laser voltage from preamplifier laser voltage monitoring ability and calculate the derivative of the laser voltage with respect to laser current, as the laser current is varied from a starting value to an ending value. A preamp can have the ability to sense, monitor, measure, or a combination thereof, the voltage across the laser diode as it is biased with current. The preamp can report this laser voltage out to a controller, or internally, as either a digital value via a preamp register or via an analog output line. The laser voltage monitor circuit 243 can also calculate the second derivative of the laser voltage with respect to the laser current. From the second derivative multiplied by the laser current, the laser voltage monitor circuit 243 may determine the maximum peak of the absolute value of the resulting signal. Where the peak occurs, the current value can be determined and the resulting current value can be used as the laser threshold bias current value, via the laser bias control circuit 245. The laser bias control circuit 245 can use the established laser threshold bias current value and write that value to the laser bias current register, where the register value sets the bias current value output to the laser.

The preamplifier 202 may also provide the first derivative signal or the second derivative signal, or both, at one or more analog outputs of the preamplifier 202. Further the preamplifier 202 may store an ADC result of the resulting current value.

In some embodiments, the laser bias control circuit 245 can perform the calibration of the laser threshold when a data storage device seeks a head from a first location to a second location. The laser bias control circuit 245 can adjust the laser bias value during a seek (whether an individual track seek or an adjacent track seek) prior to a write event, where the laser bias value sets the laser diode to a known amount of laser power. The laser bias value can be used as a threshold to determine if the laser power is too low or too high during further laser bias calibration operations.

For example, the preamp can temporarily enter a threshold detection mode during a seek where the bias current can be swept over a defined range, such mode can be triggered by a falling edge of a write gate (entering read mode) or when a user initiates a calibration command via a serial port transfer to a specific register of the preamplifier 202. The defined range of the current for the bias sweep can be programmed via two registers in the preamplifier separate from a register that sets the bias current. Thus, the bias current will be ramped from a start value "IbiasA" to a stop value "IbiasB". The ramp rate/slew rate can be programmable to balance a time allowed for the sweep with the change in bias current (i.e 10 mA/uS to 50 mA/uS). The programmed range of the current can be much larger than the threshold region if there is time to sweep the range. For example, if there is enough time within a seek time, the current range can be larger than the threshold region. The time to sweep and compute is a function of the range and slew rate programmed.

Figure 3A:
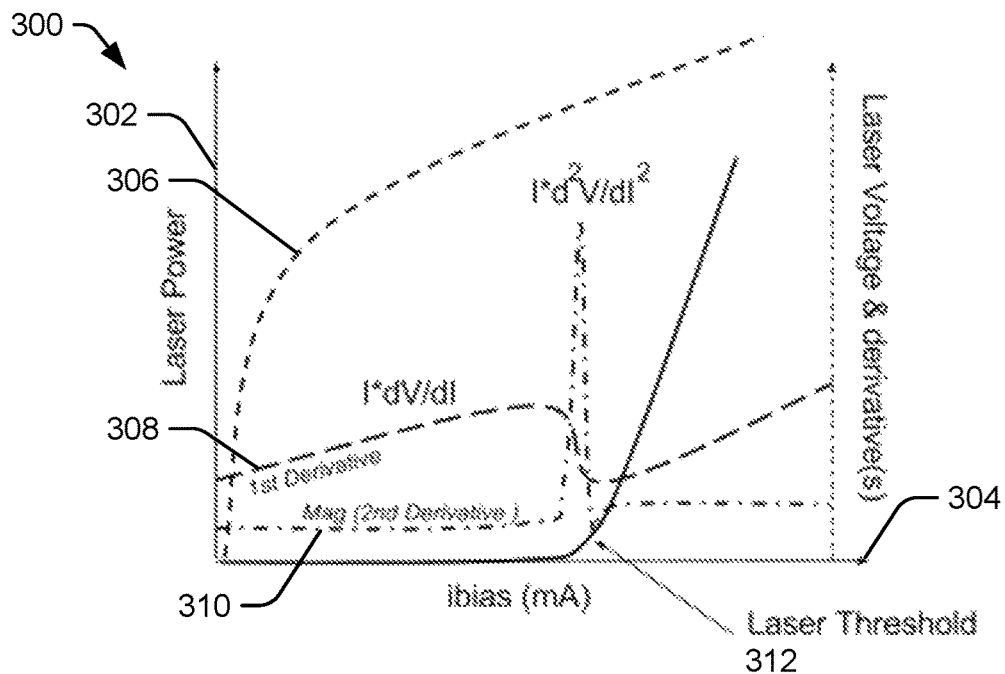
FIG. 3A is a diagram of a method of laser bias control, in accordance with certain embodiments of the present disclosure.

Referring to FIG. 3A, a diagram of a method of laser bias control is shown and generally designated 300. The diagram 300 shows the relationship between the laser power 302 and the laser threshold 304.

The signal 306 represents the laser voltage as the bias current is varied over a range. While the current is varied, the voltage monitoring circuit can determine the first derivative and multiply it by the laser current to achieve signal 308. The voltage monitoring circuit can also determine the second derivative signal and multiply it by the laser current to achieve signal 310, while the current is being varied. The voltage monitoring circuit can include a programmable threshold detector that can determine the maximum peak of the absolute value of the second derivative signal 310, which point in time of the current sweep represents the value of the bias current to set in the preamplifier.

Figure 3B:
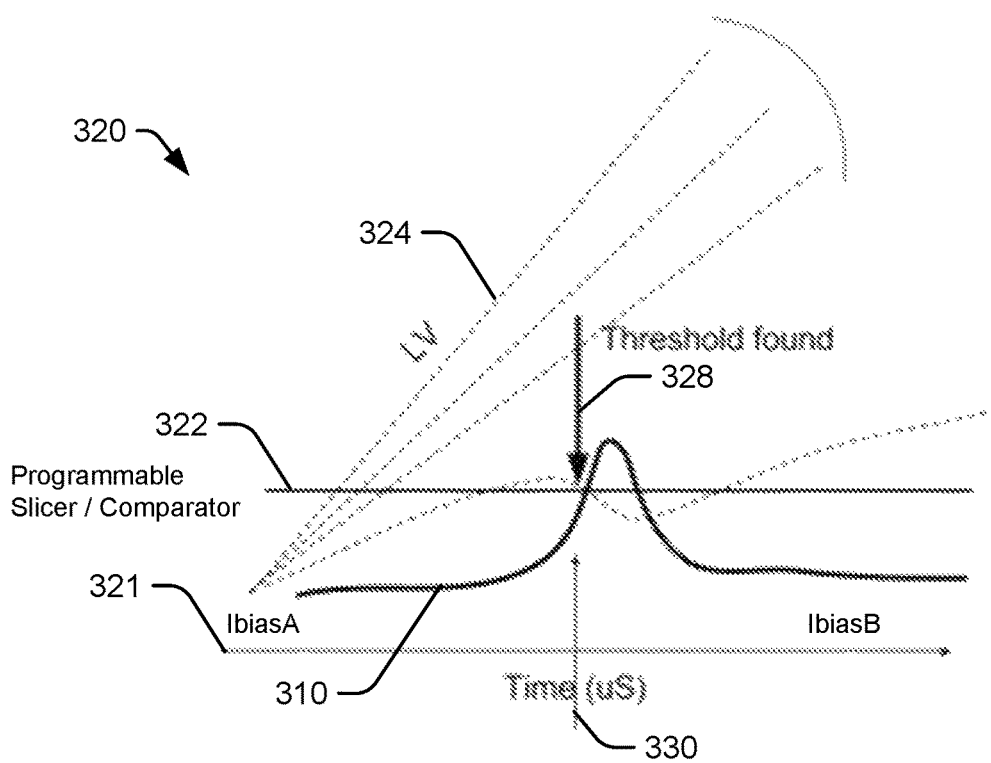
FIG. 3B is a diagram of a method of laser bias control, in accordance with certain embodiments of the present disclosure.

Referring to FIG. 3B, a diagram of a method of laser bias control is shown and generally designated 320. The diagram 320 shows the relationship between the second derivative 310 and the bias laser current 321 as the bias laser current 321 is varied over a range of currents, for example from $I_{biasA}$ to $I_{biasB}$. A programmable comparator 322 can be set to a threshold value.

As the laser voltage 324 changes due to the varying change in the bias laser current 321, the second derivative signal 310 can be monitored and once it crosses (e.g. trips or triggers a detector) the threshold value, at 328, the value of the bias current can be determined, at 330. This bias current can be sensed, digitized, and stored within the preamplifier for use as the bias current for the laser output.

Figure 4:
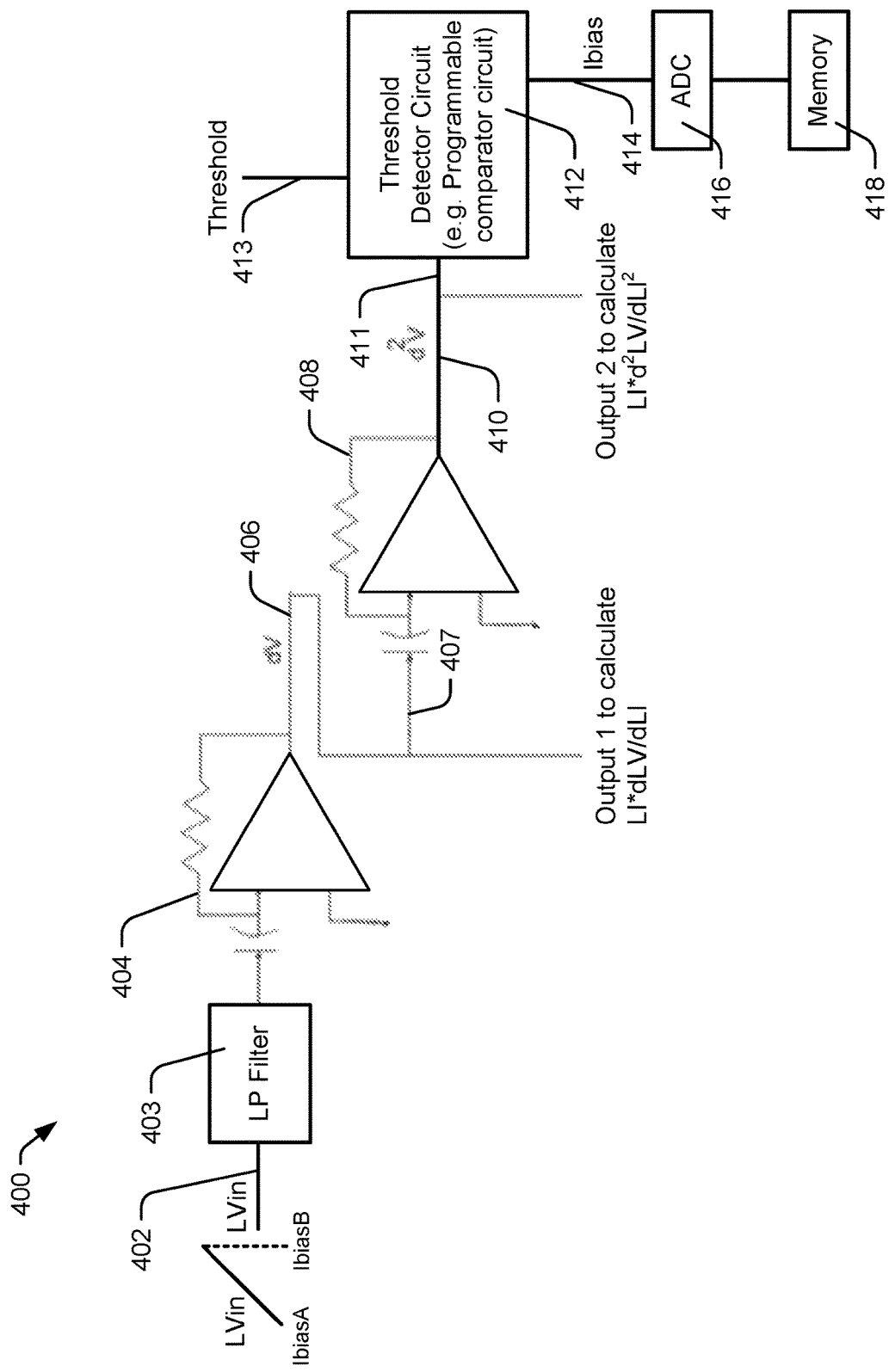
FIG. 4 is a circuit diagram of a system of laser bias control, in accordance with certain embodiments of the present disclosure.

Referring to FIG. 4, a circuit diagram of a system of laser bias control is shown and generally designated 400. The circuit 400 may be utilized in the systems 100 and 200 described herein, as well as with the methods described herein to obtain a laser bias current threshold value for use with a laser emitting circuit. The circuit 400 may include a first differentiator circuit 404 having a first input 402 and a first output 406. The circuit may also include a second differentiator circuit including a second input 407, coupled to the first output 406, and a second output 410. The circuit 400 may also include a threshold detector circuit 412 having an input 411 tied to the output 410, a threshold setting input 413, and an output 414.

During operation, the first input 402 may receive a measurement of the laser voltage representing a change of current in the bias current value as the bias current is varied over a range. The range may be predetermined, or may be manually set by a controller or user. The first differentiator circuit 404 can calculate a first derivative signal of the laser voltage input signal and provide the first derivative signal at the first output 406. The first derivative signal may be provided to the second differentiator circuit 408, which can calculate a second derivative signal of the laser voltage input signal. The second differentiator circuit 408 can provide the second derivative signal from the second output 410 to the input 411 of the threshold detector circuit 412.

The first and second derivatives can be made available out one or more an analog outputs, in addition to being used internally in the preamplifier for processing, such as finding the max of the second derivative. The digitization of the resulting first and second derivatives can be achieved within the preamp circuitry with a continuous running ADC circuit, which can store values in a memory of the preamp.

The threshold detector circuit 412 can receive the second derivative signal and compare the second derivative signal to a threshold 413, such as via a programmable comparator circuit. When the second derivative signal reaches the threshold, the bias current at that point in time can be determined and provided as an output 414. Also, the variances in the bias current 402 can be stopped when the threshold is reached.

In some embodiments, the bias current output 414 can be supplied to an analog to digital converter (ADC) circuit 416 to take a digital sample of the bias current and store it in memory 418. For example, the ADC 416 can include a sample and hold circuit that is configured to sample an analog value of the bias current upon a trigger, such as the second derivative reaching the threshold, and digitize the sample to be stored in the memory 418. The sample, representing the bias current value, can be used by the laser calibration process to set the bias current for a laser emitter. The memory 418 may be part of or coupled to a preamplifier and may be utilized by a digital to analog converter (DAC) circuit 235 of the preamplifier to determine an analog output for a laser bias current.

Figure 5:
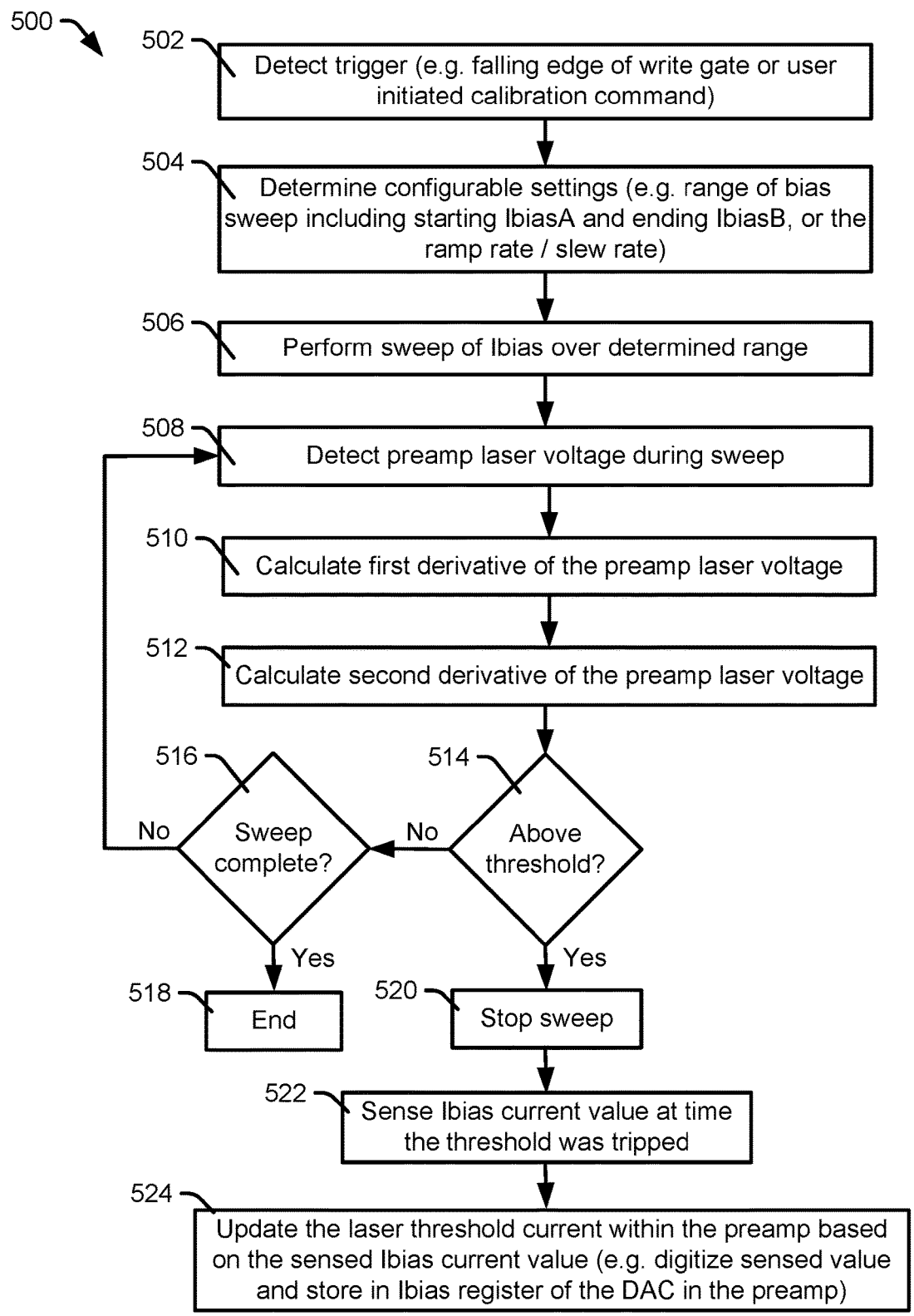
FIG. 5 is a flowchart of a method of laser bias control, in accordance with certain embodiments of the present disclosure.

Referring to FIG. 5, a flowchart of a method of laser bias control is shown and generally designated 500. The method 500 may be performed by the systems described herein, such as systems 100 or 200. The method 500 may be utilized by a system that drives a laser emitter via a preamplifier. The method 500 may be utilized to automatically determine the actual bias current at a threshold using a programmable threshold detector.

The method 500 may be automatic and may start by detecting a trigger, such as a falling edge of a write gate or a user initiated calibration command, at 502. The method 500 can also include determining configurable settings, such as a range of current for a bias sweep including starting current, IbiasA, and an ending current, IbiasB, or the ramp rate/slew rate, at 504. The method 500 may then perform the sweep of the bias current over the determined range, at 506.

While the bias current is being varied over the determined range, the system can detect the laser voltage during the sweep, at 508. The detected laser voltage can be fed to a first differentiator circuit to calculate a first derivative of the laser voltage, at 510. A second differentiator circuit can then calculate a second derivative of the laser voltage from the output of the first differentiator circuit, at 512. The output of the second differentiator circuit can be input to a comparator circuit to determine if the second derivative is above a threshold, at 514. The threshold may be set via a programmable comparator circuit.

The first derivative and second derivative may be determined by digital means, such as digitizing the signal and storing it in memory for processing, or by analog circuitry.

When the second derivative is not above the threshold, and the current has not reached the ending current of the sweep, the process 500 may continue processing the laser voltage and derivatives, at 516. When the ending current of the sweep has been reached and the threshold was not reached, the process 500 may end without a change in the laser current bias settings, at 518.

When the second derivative has reached or is above the threshold, the process 500 may stop performing the current variances, at 520. At the time the second derivative trips the threshold trigger, or as close thereto as practicable, the method 500 can sense the value of the bias current, at 522. The method 500 can then update the laser threshold current within the preamp based on the sensed bias current value, at 524, such as by digitizing the sensed value and storing it in a memory register allocated for setting the laser threshold bias current in the preamp. At some later time, such as a next occurring write (or other laser function), the laser threshold current value stored in the preamp can be applied to the laser.

In some examples, laser bias control processes can, when the preamp is sweeping the laser bias current from IbiasA to IbiasB and performing the 2nd derivative of the monitored laser voltage, once the detector threshold is tripped, and the system has found the laser threshold current value, that value may fall between two available digital values, depending on the resolution of the sample and the digital values. If the resolution of the DAC is fairly fine (e.g. on the order of 0.1 mA/step), the processes can have the preamp select the closest digital value to the actual value found and store that digital value in a memory or register.

Figure 6:
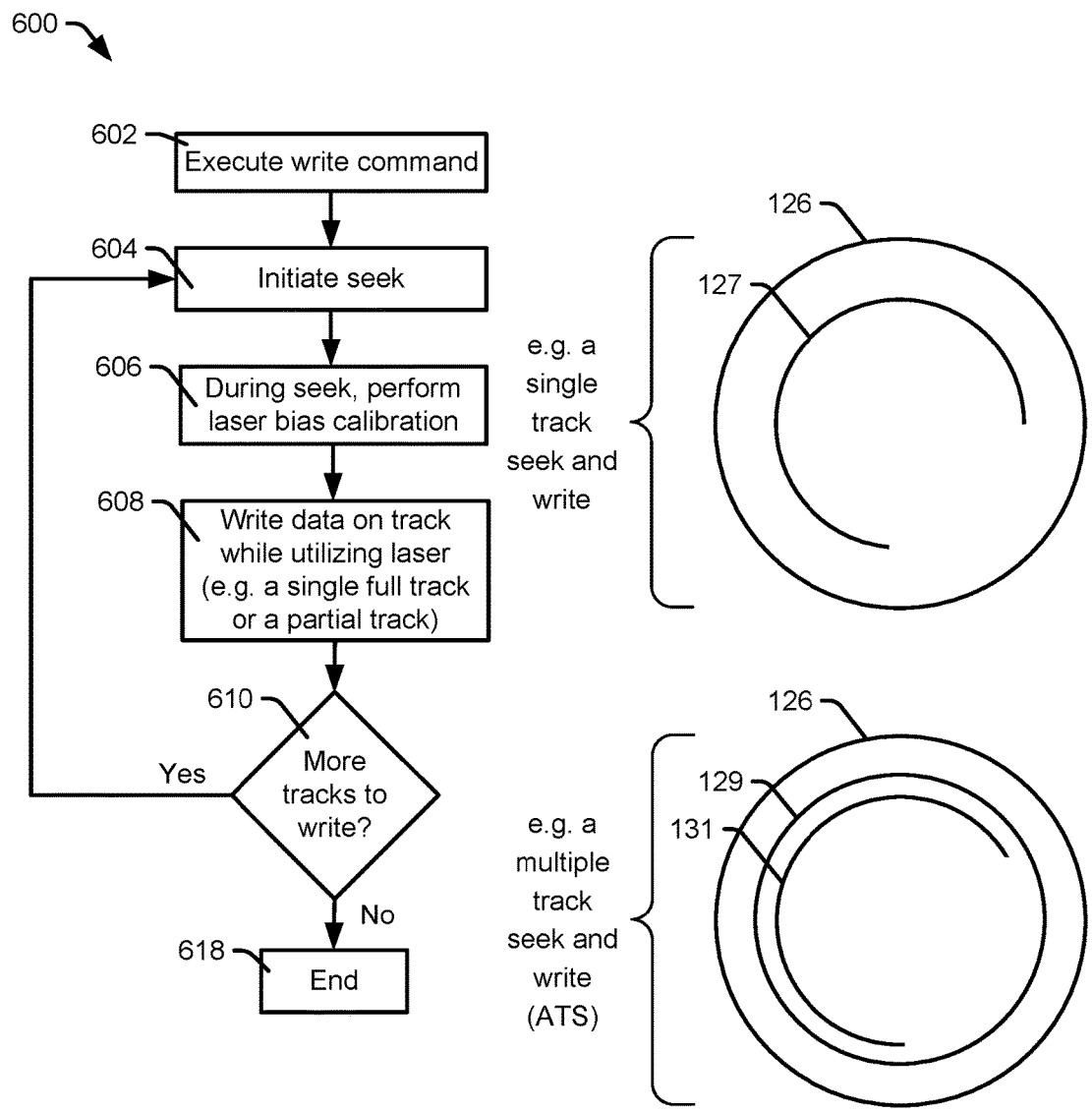
FIG. 6 is a flowchart of a method of laser bias control, in accordance with certain embodiments of the present disclosure.

Referring to FIG. 6, a flowchart of a method of laser bias control is shown and generally designated 600. The method 600 may be performed by the systems described herein, such as systems 100 or 200. The method 600 may be utilized by a track based data storage device to optimize a bias current of a laser emitter.

The method 600 may start or be activated by a write command being executed, at 602. This may include detection of a falling edge of a write gate, which indicates the preamp is entering a read mode and may be performing a seek command preparing to write another track. During execution of the write command, a seek of a write head to a target track on the data storage medium can occur, at 604. During the seek, a laser bias calibration, as discussed herein such as methods 300 or 500 can be performed, at 606. The seek can be a single track seek, as depicted by track 127, or can be an adjacent track seek (ATS), as depicted by tracks 129 and 131. The timing of the laser bias calibration can be such that it is short enough to be accomplished within an amount of time for an ATS to be performed. After the seek is complete, and hence the laser bias calibration is complete, the updated laser threshold current value can be applied to the laser and data can be written on the target track, at 608. Additionally, a predetermined laser input/output operation value can be added to laser threshold current to perform proper lasing (heating) of the media for a successful write.

If there is more than one track to write, such as in a write command that includes a long sequential write that includes more than one track worth of data, the method 600 can determine if there is another track to write, at 610, and proceed to repeat the process if there is more tracks to write, at 604. For example, track 129 may be seeked to initially, then fully written, and due to the same write command, a short ATS seek may occur to write data to track 131, which may be adjacent to track 129. Typically, an ATS seek is much shorter than an individual track seek. When there are no more tracks to write, the method 600 may end, at 618.

While various examples herein discuss performing laser bias calibration and control during a write process of a data storage device, the methods can also be performed during a read mode of a HAMR or optical data storage device. For example, laser bias threshold determinations, laser power monitoring, digitization of signals, power comparison, and power adjustments may be performed in read mode when the data storage device is performing track seeks. In such examples, a laser power that is adjusted may be laser bias (threshold current) values.

While the above description includes some embodiments that describe data storage device implementations, the present disclosure can be applied to any system that needs to monitor power. For example, the present disclosure can be utilized in any laser system that needs to monitor and adjust output power of the laser. Further, the elements of the different methods and systems described herein may be combined or modified.

This disclosure is intended to cover any and all subsequent adaptations or variations of various embodiments. Combinations of the above embodiments, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. A device comprising:
a heat-assisted magnetic recording (HAMR) data storage device having:
a disc data storage medium having data tracks to store data;
a laser emitter configured to heat the data tracks during write operations;
a preamplifier circuit configured to determine a laser threshold current level to apply to the laser emitter based on a voltage of the laser emitter, including:
an output to provide current to the laser emitter;
a laser voltage monitor circuit configured to determine the voltage corresponding to the output;
a first differentiator circuit configured to calculate a first derivative of the voltage;
a second differentiator circuit configured to calculate a second derivative of the voltage based on the first derivative;
a laser bias control circuit configured to determine the laser threshold current level for the output based on the second derivative and apply the laser threshold current level to the output of the laser emitter; and
the laser bias control circuit including a threshold detector circuit configured to determine when the second derivative of the voltage reaches a threshold and update the laser threshold current level based on a bias current value corresponding to when the threshold was met.

2. The device of claim 1 further comprising the laser bias control circuit further includes one or more programmable current setting registers to store a starting current and an ending current, and the laser bias control circuit is configured to apply a variable current to the output, varying the starting current to the ending current to vary the voltage.

3. The device of claim 2 further comprising the laser bias control circuit configured to determine a rate at which the variable current must change based on a programmable setting.

4. The device of claim 1 further comprising:
the data storage device including a magnetic read/write head to write data to the data tracks;
the preamplifier configured to:
provide a write current to the head to write data to the data tracks while the laser emitter is heating a corresponding area;
determine the laser threshold current level during a track seek prior to a write occurring; and
apply the laser threshold current level during a next occurring write.

5. The device of claim 4 further comprising the track seek is an adjacent track seek.

6. A circuit comprising:
a preamplifier for a heat-assisted magnetic recording (HAMR) data storage device, the preamplifier configured to determine a laser bias current level to apply to a laser emitter based on a voltage of the laser emitter and including:
an output to provide current to a laser emitter to heat tracks of a disc data storage medium during write operations;
a laser voltage monitor circuit configured to determine a voltage corresponding to the output;
a first differentiator circuit configured to calculate a first derivative of the voltage;
a second differentiator circuit configured to calculate a second derivative of the voltage based on the first derivative; and
a threshold detector circuit configured to determine a laser bias current level for the output based on the second derivative reaching a threshold, and configured to apply the laser bias current level to the output.

7. The circuit of claim 6 further comprising a current varying circuit configured to determine a start current and an end current greater than the start current, and to apply the start current to generate the voltage and increasing the current to increase the voltage until the end current is reached.

8. The circuit of claim 6 further comprising a low pass filter configured to receive the voltage from the laser voltage monitor circuit and to provide a filtered voltage signal to the first differentiator circuit.

9. The circuit of claim 6 further comprising the threshold detector circuit includes a programmable comparator configured to allow changing of the threshold.

10. The circuit of claim 6 further comprising an analog to digital converter circuit configured to receive the laser bias current level and store a digital value representing the laser bias current level to a memory.

11. The circuit of claim 6 further comprising the circuit is a preamplifier circuit for a data storage device that includes a laser emitter.

12. A method comprising:
determining a laser bias current threshold value to apply to a laser emitter of a heat-assisted magnetic recording (HAMR) data storage device based on a laser voltage of the laser emitter, in which the laser emitter is configured to heat tracks of a disc data storage medium during write operations, including:
varying a bias current of the laser emitter over a range of currents;
detecting the laser voltage corresponding to the bias current;
determining the laser bias current threshold value based on the laser voltage;
applying the laser bias current threshold value to the laser emitter;
determining the laser bias current threshold value includes:
calculating a first derivative of the laser voltage via a first differentiator circuit;
calculating a second derivative of the laser voltage via a second differentiator circuit;
comparing the second derivative to a threshold; and
sampling the laser bias current when the second derivative reaches the threshold to obtain the laser bias current threshold value.

13. The method of claim 12 further comprising low pass filtering the laser voltage prior to calculating the first derivative.

14. The method of claim 12 further comprising sampling the laser bias current via an analog to digital converter circuit and applying that laser threshold bias current value to a register controlling the bias current of the laser.

15. The method of claim 12 further comprising determining a start current and an end current for the range of currents based on one or more values in a programmable memory register, applying the start current to generate the laser voltage, and increasing the bias current to increase the laser voltage until the end current is reached or the threshold is met.

16. The method of claim 15 wherein the method is entirely performed within a single preamplifier integrated circuit.

* * * * *